United States Patent [19]
Schermutzki

[11] Patent Number: 4,690,721
[45] Date of Patent: Sep. 1, 1987

[54] APPARATUS AND PROCESS FOR THE PRODUCTION OF MULTILAYER LAMINATED PLATES

[75] Inventor: Konrad Schermutzki, Remseck, Fed. Rep. of Germany

[73] Assignee: Santrade Ltd., Lucerne, Switzerland

[21] Appl. No.: 624,925

[22] Filed: Jun. 25, 1984

[30] Foreign Application Priority Data

Jul. 6, 1983 [DE] Fed. Rep. of Germany ....... 3324302

[51] Int. Cl.$^4$ .............................................. C09J 5/02
[52] U.S. Cl. .............................. 156/307.5; 156/307.7; 156/324; 156/499; 156/543; 156/583.5
[58] Field of Search .................. 156/307.5, 307.7, 324, 156/499, 543, 583.5

[56] References Cited

U.S. PATENT DOCUMENTS

| | | | |
|---|---|---|---|
| 3,236,714 | 2/1966 | Traut | 156/249 |
| 3,834,964 | 9/1974 | Blasing | 156/324 X |
| 4,087,300 | 5/1978 | Adler | 156/324 X |
| 4,278,491 | 7/1981 | Morse | 156/543 X |
| 4,334,468 | 6/1982 | Güttinger et al. | 156/583.5 X |

FOREIGN PATENT DOCUMENTS 2613081 11/1976 Fed. Rep. of Germany.
2722262 7/1979 Fed. Rep. of Germany.

Primary Examiner—Robert A. Dawson
Attorney, Agent, or Firm—Burns, Doane, Swecker & Mathis

[57] ABSTRACT

Apparatus for the production of multilayer laminated plates, in particular circuit boards for electrotechnical applications, wherein webs of glass fiber roving fabric are impregnated with a synthetic resin binder, and subsequently pressed in a dual belt press. Upstream of the press, a heating table comprising a plurality of heating panels is provided. The webs of material, coated with the binder, are combined and impregnated in the heating zone. In the heating zone the binder used may be maintained exactly at the processing temperature. Rapid hardening binders may be used so that the transition of the binder from its liquid to its solid state takes place in the press even during short press durations.

20 Claims, 3 Drawing Figures

APPARATUS AND PROCESS FOR THE PRODUCTION OF MULTILAYER LAMINATED PLATES

BACKGROUND AND OBJECTS OF THE INVENTION

The invention concerns an apparatus for the preparation of multilayer laminated plates, in particular, printed circuit boards for electrotechnical applications, wherein several webs of materials are brought together continuously by means of feeder installations, impregnated with a binder and subsequently pressed.

Various means are known for the preparation of multilayer laminated plates. For example, multilayer presses have found widespread use, into which webs of materials impregnated with binders are placed and pressed with a plunger. One difficulty of the process is that the applicable binders are solidified at room temperature and therefore must be mixed with a solvent in order to render the impregnation of the material webs possible. The solvent must then be removed by drying, making the process more cumbersome and labor intensive. Also, since the individual layers of each of the laminated plates to be produced must be manually stacked and placed in the multilayer press and removed after the pressing step, the capacity of such presses is low. Finally, the pressing time of laminating presses of this type is relatively long, as the point in time at which the binder passes into its solid state cannot be accurately determined and depends on a number of different factors, so that the impregnated webs of material must be left in the press until this point in time has safely passed.

Proposals for installations for the production of multilayer laminated plates have therefore already been presented, whereby the afore-described disadvantages, in particular, the low capacity of such devices were intended to be elminated. In DE-OS No. 26 13 081 for example, an apparatus of the afore-mentioned type is described, in which the individual webs are (i) brought together in an impregnating bath, (ii) moved with the aid of rolls several times into the bath and out of it, (iii) subsequently alternatingly flexed and pressed by means of calender rolls and, finally, (iv) finish pressed in a smoothing mill. The multilayer web may be heated or cooled both in the calender and the smoothing mill, wherein the rolls themselves may be heated or cooled.

This known apparatus does not, however, completely solve the problems encountered with multilayer presses. As the binder, for example a synthetic resin, requires a relatively long period of time for hardening, the transport velocity and the capacity of the apparatus cannot be increased arbitrarily. In order to maintain the resin in a liquid state in the impregnating bath, the pot-life must be made long, which in turn, results in a relatively long hardening time. Furthermore, the entire apparatus is rendered complex and expensive by the use of several rolling and squeezing systems. Finally, it cannot be warranted that the binder will attain its point of transformation from the liquid to the solid state exactly at the moment of its passage through the smoothing rolls. Since this transformation occurs abruptly in the case of many binders, premature or belated pressing leads to the discharge of excessively pressed plates or laminated plates with inadequate adhesion.

It is an object of the present invention to provide an apparatus of the afore-mentioned type whereby the above-cited disadvantages are avoided. The apparatus should, in particular, have a high capacity and should not be excessively costly.

SUMMARY OF THE INVENTION

This object is attained by providing a heating zone in front of the press installation, and bringing the binder-carrying webs together and combining them within the heating zone as they are impregnated with the binder. It is the function of this heating zone to maintain the binder in its processing state during the combination of the individual layers. The use of solvents is thereby eliminated. In addition, different binders, in particular, rapidly hardening binders may be employed. The use of a rapidly hardening binder has the further advantage that the time when the point of transformation from the liquid to the solid state is attained is reached very rapidly. This point of time can therefore be covered even in the case of very short retention times of the webs of materials in the press installation itself. As a result, laminated plates which have been pressed at the proper time and which are therefore stable are obtained, simultaneously with a high capacity of the press. It is possible further to use not only a binder that is liquid at room temperature, but also one that is solid at room temperature and is heated in the heating zone. Finally, by means of the heating of the webs of the materials, an improved impregnation of the webs is obtained. The structural layout of the heating zone may be simple so that there is a cost advantage over known configurations.

In particular, in the production of printed circuit boards for electrotechnical purposes, the individual material webs may comprise a glass fiber roving fabric. The webs may be provided on one or both sides with copper conductors. As the binder, a synthetic resin, in particular epoxy resins, may be used. The resin must be capable of flowing during processing. Therefore, for example, a rapidly hardening resin that is flowable at room temperature may be used, or a resin that is solid at room temperature and is heated prior to processing and maintained in the liquid state for the impregnation of the material webs by the heating zone according to the invention. The solvents required heretofore, for example, an acetone mixture, are no longer needed as mentioned above, as the resin is maintained in the liquid, i.e., the workable, state and there is also a reduction in viscosity. In the case of low viscosities good impregnation is obtained by means of the wick effect of the glass fiber fabric.

In an advantageous and structurally especially simple embodiment, the heating zone includes a heating table over which the webs of materials are passed. The webs are maintained at the necessary temperature by contact with the heating table. This eliminates the need for more elaborate heating means, for example, heated housings. Furthermore, the consumption of thermal energy is very low in this configuration. It is advantageous to provide the heating table as a combination of a plurality of heating panels. The heating panels may be assembled in an arbitrary manner so that the material webs may be guided in different ways. In addition, this simplifies the assembly, dismantling and transportation of the heating table.

An advantageous form of embodiment of the invention provides for curved heating panels arranged end-to-end to form an arch-shaped table. This prevents the drawing in of air during the fitting together of the webs. Undesirable air inclusions are also prevented. The webs are exposed to different degrees of pre-stressing (i.e., in an arc curving in the upward direction, for example, the uppermost web is pre-stressed more highly than the others), a defined contact pressure and good impregnation are obtained. It is further advantageous to arrange the heating panels flat and arranged end-to-end to form an arch.

In an advantageous further development of the invention, additional heating elements, e.g., heating panels, are spaced above webs transported over the heating table. This results in a heating from all sides of the material to create a homogeneous temperature distribution so that the flow properties of the binder remain constant at all points. It is advantageous to introduce the material webs between the successive heating elements. The webs of material are thus transported to the heating table, not at a single point, but with a defined spacing. This measure further reduces the risk of air inclusions, as each individual material web is fed-in only when the preceding web is already in good contact with the other webs of material and is thoroughly impregnated.

The individual webs may be passed over braking rolls in a convenient manner after their removal from the storage roll. A constant tension in the webs is thereby assured.

It is further advantageous to pass the webs of material over two reversing rolls initially against the direction of transport, coating them in the process from above by means of a feeder device each with a binder, in particular a resin, and subsequently passing them over a further reversing roll to the heating table. On the heating table itself the binder is then under the web of material and penetrates it from bottom to top, thereby displacing any potentially present air inclusions. The problem of the inclusion of air may thus be completely eliminated.

It is appropriate to arrange under the feeder devices and on the other side of the webs of material, a heating and/or cooling element. By means of this heating or cooling element, the binder may be maintained at the temperature desired. Particularly when using resins that are solid at room temperature, the resins may be kept in a flowable state prior to their introduction.

When using reversing rolls, it is further possible to pass always two webs together to the first reversing roll. The binder is readily capable of penetrating two webs of the material. The structural layout of the installation according to the invention is thereby substantially simplified, as only one-half of the feeder devices and heating or cooling elements must be provided.

For the transportation of the webs of material through the heating and impregnating zone, a carrier sheet may be supplied from below. To obtain constant and homogenous temperature conditions it is advantageous to use a carrier sheet that is thin and has good thermal condutivity so that it may be heated rapidly. An advantageous carrier sheet comprises a thin foil of copper as the carrier material. The copper foil is bonded in the process to the material webs. When the apparatus according to the invention is used for the production of printed circuit boards for electrotechnical applications, the copper foil may be further treated, so that the external side of the laminated plates may be used for the configuration of conductor strips. It is obviously necessary in this case for the copper foil to have an adequate thickness and to be handled correspondingly, for example, in a clean room.

Since the carrier foil under certain conditions is very thin and therefore cannot be exposed to strong mechanical stresses, it is further advantageous to provide the webs of the material under the carrier foil with a parting sheet. This parting sheet protects the carrier foil against contamination and contact with the transport installation and absorbs most of the mechanical load.

The material webs may further be supplied after their passing through the heating zone, but prior to the press installation, a second carrier foil, in particular a foil of copper, from above. This measure is especially appropriate when printed circuit boards are produced in the apparatus according to the invention and they are to have copper lamination on both sides following the completion of the pressing process. It is obviously possible to provide the webs of material with a second parting foil over the second carrier foil performing the same function as the first parting foil, in particular, the relief of mechanical stresses, prevention of contamination and protection during the pressing process.

The press installation itself may have a configuration known in itself. It is especially advantageous to use a dual belt press. This dual belt press renders a high capacity continuous press operation possible as the material webs may be passed as a strip through it.

THE DRAWING

The objects and advantages of the invention will become apparent from the following detailed description of preferred embodiments thereof in connection with the accompanying drawings in which like numerals designate like elements, and in which.

DETAILED DESCRIPTION OF PREFERRED EMBODIMENTS OF THE INVENTION

Figure 1:
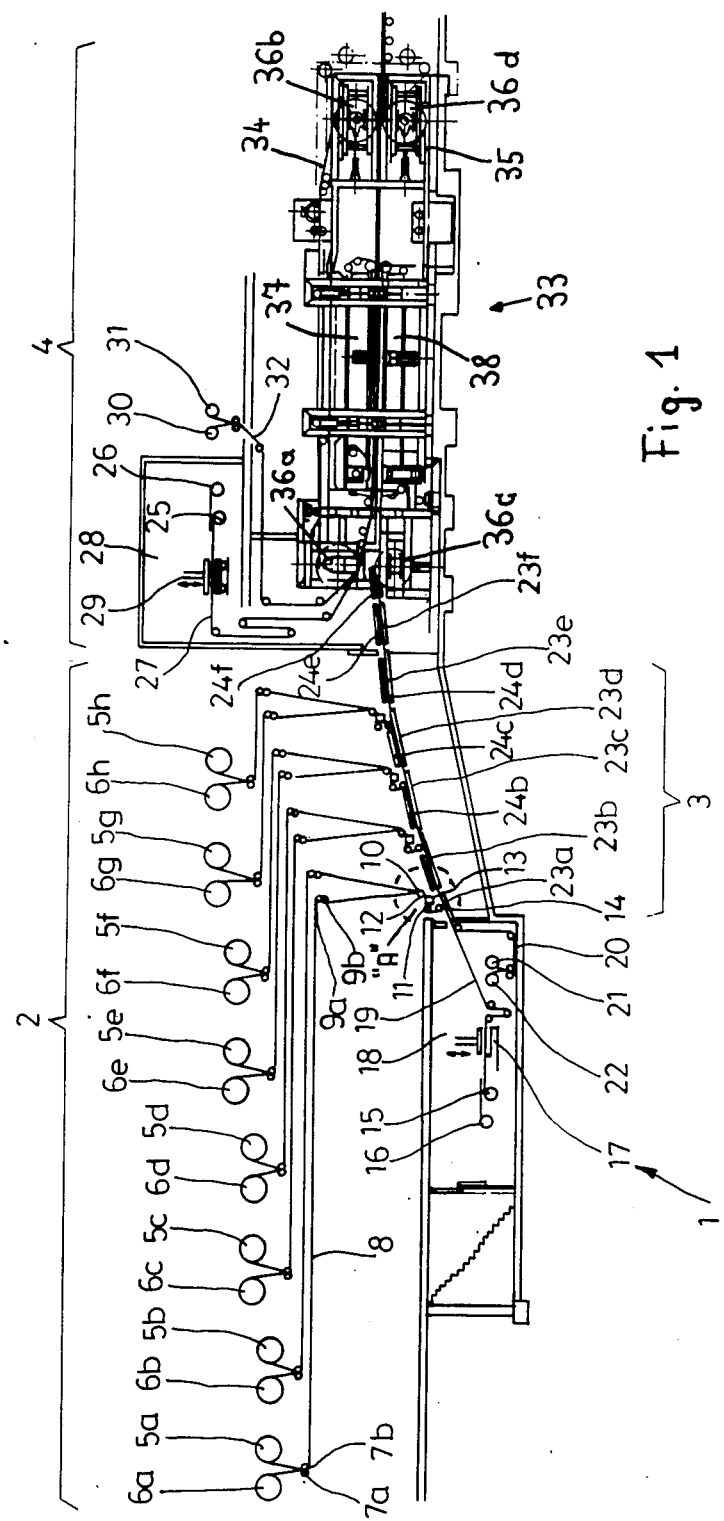
FIG. 1 is a schematic overall view of an apparatus according to the invention.

FIG. 1 shows an apparatus 1 according to the invention, in this case specifically for the production of printed circuit boards for electrotechnical applications. The apparatus is divided essentially into three sections, namely, feeder devices 2, a heating zone 3, and a press installation 4.

Individual material webs comprised of a glass fiber roving fabric are on storage rolls 5a to 5h and are drawn off for processing. To make possible a smooth operation, there is provided a plurality of additional supply rolls 6a to 6h in addition to the storage rolls, from which the glass fiber fabric may be drawn when the storage rolls are exhausted. Thus, there is no need to stop the installation while changing the supply rolls. Following its removal from the supply rolls, the glass fiber roving fabric is passed over reversing rolls, of which only two are designated by 7a and 7b, as examples.

Figure 2:
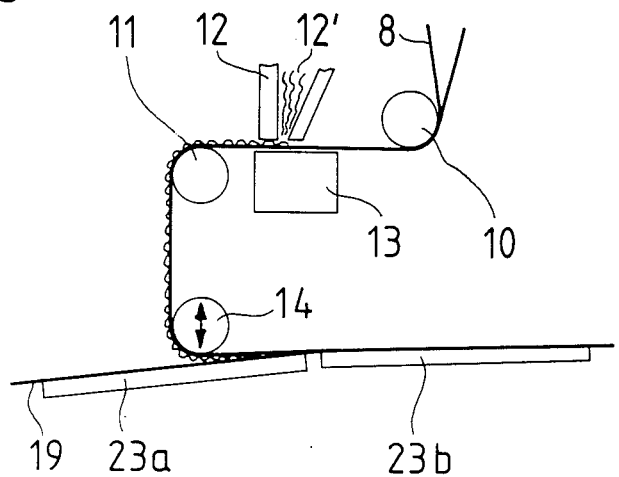
FIG. 2 shows the detail "A" of FIG. 1 enlarged.

The glass fiber fabric 8 then passes over braking rolls 9a and 9b, the function whereof is to maintain a constant tension in the glass fiber fabric, and arrives at upstream and downstream reversing rolls 10 and 11 (FIG. 2). The latter are placed so that the glass fiber fabric passes between them in a direction opposite to the direction of transport through the heating zone 3. Over the section of the fabric passing between the rolls 10, 11 is disposed a feeder device 12 for introducing a binder, which in this case is a synthetic resin, in particular an epoxy resin. By means of a temperature control element 13 arranged under the feeder device 12 on the other side of the web of material, the synthetic resin may be maintained at the appropriate processing temperature. Depending on the type of resin used, the element 13 may be a heating or a cooling element. This measure eliminates the use of solvents as components to be mixed with the resin, because the latter is being kept by the element 13 at its processing temperature. In particular, a resin that is solid at room temperature may be used, if the element 13 is a heating element. In view of the heating and the high transport velocity of the apparatus according to the invention, a rapidly hardening resin may be further used. This results in the fact that the point of transformation from the liquid to the solid state of the resin is attained in a relatively short period of time. The press time may be controlled so that this point in time is attained with certainty during pressing so that satisfactorily pressed circuit boards are obtained, while the retention time in the press may be relatively short. The high capacity of the apparatus according to the invention is not affected.

The glass fiber roving fabric 8 coated with the synthetic resin is then passed over a further reversing roll 14 to the heating zone. The layer of resin is now located on the underside of the glass fiber roving fabric and penetrates through the fabric from bottom to top, whereby any potentially present air is displaced from the fabrics. The resin 12' is shown in FIG. 2 schematically as a wavy structure.

The above-described apparatus keeps the resin at a very uniform temperature during the coating of the glass fiber roving fabric 8, for example being cooled, whereby favorable processing properties are obtained. FIG. 2 further shows that the glass fiber fabric comes into contact with a heating panel 23a only at the end of the heating panel (the right end in FIG. 2). The resin is therefore again heated accurately and brought to the flow temperature, prior to its contacting a copper foil 19 used as the carrier foil.

Figure 3:
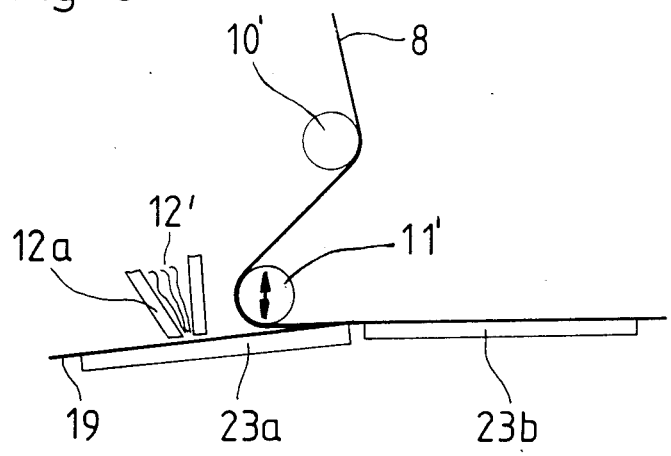
FIG. 3 depicts a further embodiment of the detal "A".

FIG. 3 shows a modified structure for feeding-in the glass fiber fabric 8. The fiber is transported over the reversing rolls 10' and 11' directly to the heating plate 23a, with the feeder device 12' for the resin being arranged above the copper foil 19 upstream of the point of merger of the fabric with the copper foil 19. This arrangement could be used with or in place of that shown in FIG. 2 or employed when only one layer of the glass fiber fabric is to be processed. When processing several layers of the fabric, it is not suitable as the subsequent location of application since the resin is applied directly to the already heated copper foil 19, thereby making accurate metering impossible, since the viscosity of the resin decreases at the point of contact. The resin could therefore run out or back laterally from the applicator cover. Application layouts according to FIG. 2 are therefore provided.

The copper foil 19 is disposed on a storage roll 15 and supply roll 16 (FIG. 1) which foil is used as the carrier material. A bonding mechanism 17 adhesively bonds the replacement foil when the storage roll has been exhausted. Since the copper foil 19, after processing in the apparatus according to the present invention, is to be used for the production of further conductor strips on the outer side of the circuit board, it must be kept free of contamination and thus is handled in a clean room 18.

The copper foil 19 is passed over various reversing rolls en route to the heating zone. For mechanical stress relief and as a protection against contamination, a parting foil 20 is applied to the underside of the copper foil.

The parting foil is drawn from a storage roll or a replacement roll 22. Both the parting foil 20 and the copper foil 19 have good thermal conductivities so that a constant and homogeneous temperature distribution and good heat conduction to the glass fiber fabric are assured.

The heating zone 3 comprises a heating table assembled from a plurality of heating panels 23a to 23f. At the upstream end of the heating table, initially the parting foil 20 and the copper foil 19 are converged. Shortly thereafter, the first two webs of the glass fiber fabric are converged onto the parting foil 20 and the copper foil 19. The resin layer applied by the feeder device 12 to the glass fiber fabric is applied to the underside of the glass fiber fabric and is able to penetrate the fabric from bottom to top, leading to the elimination of air. The heating panels 23a to 23f are maintained at a constant temperature to keep the synthetic resin constantly at its processing temperature. These heating panels are flat and arranged polygonally in the direction of transport. This arrangement extensively prevents the introduction of air between the foils. Since the upper webs are prestressed to a greater extent than the lower ones (i.e., the upper webs on an arch are stressed more than the lower ones), a defined contact pressure to the heating panels is obtained. The same advantages are attained with a layout wherein the heating panels are curved.

Spaced above the heating panels 23a to 23f are additional heating panels 24a to 24f arranged at a distance above the fabric webs. The upper heaters 24a-24f keep the webs at a constant temperature, so that they may be impregnated uniformly by the resin. Since they are located at a distance from the fabric webs, the upper heaters do not interfere with the escape of air bubbles therefrom.

Between successive ones of the upper heating panels 24a to 24d, the remaining fabric webs 8 impregnated with the resin are now introduced. In this entire area the heating table is polygonal in shape so that here again good contact pressure is assured and the inclusion of air is extensively prevented.

Prior to its introduction into the press installation 4, the glass fiber fabric is contacted from above with a copper foil 27 drawn from a storage roll 25 or a replacement roll 26. This copper foil is processed in a manner similar to the foil 19 in a clean room. A bonding mechanism 29 serves to adhesively attach the replacement foil when the storage roll 25 is exhausted. For protection and mechanical stress relief, a parting foil 32 is provided, drawn from a storage roll 30 or a replacement roll 31.

Prior to the introduction of the fabric webs into the press installation 4, cleaning devices (conventional and not shown), may be provided in order to remove dust and excess resin.

The press installation 4 comprises a dual belt press 33, comprising essentially two steel belts 34, 35, four partially or fully driven rolls 36a to 36d, and two press plungers 37 and 38. The compression zone of the dual belt press is dimensioned so that the glass fiber fabric is, with certainty, still in the compression zone at the point in time when the transition from the liquid to the solid state takes place. Since, in the apparatus according to the invention, rapid hardening resins may be used, the press retention time should not be overly long so that the apparatus can be used to full capacity. A pressing pressure in the dual belt press of between 0.2 and 20 bar is sufficient.

The steel belts 34, 35 are preferably sprayed with a mold parting agent and fixed over heated rolls.

Following the dual belt press, it will be appparent that further installations may be arranged, such as for secondary hardening and/or the cutting of the circuit boards, or for the surface treatment of the outer layers of copper.

The invention thus provides an apparatus wherein the use of solvents is eliminated and wherein rapid hardening resins and resins solid at room temperature may be used, since proper processing temperatures are maintained by a heating and/or cooling element 13. Following the coating of the fabric webs, they are passed to a heating zone 3 so that the resin remains capable of being processed. The coating of the underside of the fabric webs results in a penetration of the resin from the bottom through the webs, whereby air inclusions during the impregnation process are avoided. Coating on the underside is preferably achieved by coating the material web while the latter travels in a direction opposite that in which the web travels as the resin is being pushed therethrough.

Although the present invention has been described in connection with preferred embodiments thereof, it will be appreciated by those skilled in the art that additions, modifications, substitutions, and deletions may be made without departing from the spirit and scope of the invention as defined in the appended claims.

What is claimed is:

1. Apparatus for the production of multi-layer laminated plates, such as electronic circuit boards, from webs of pregnable fibrous material, said apparatus comprising:
   supply means for supplying webs of pregnable fibrous material,
   advancing means for advancing said webs, including a dual belt press,
   binder applying means for applying a binder substance to a web first surface as said webs are being advanced,
   means for stacking said webs one upon the other, and
   a temperature control zone through which said webs are advanced in stacked condition, said temperature control zone disposed upstream of said dual belt press and comprising:
      table means along which said stacked webs travel, and
      means for regulating the temperature of said binder substance,
   said binder applying means comprising:
      means for depositing said binder substance onto said web first surface, and
      reversing roll means for reversing the direction of web travel in advance of said table means and following the application of said binder substance so that said web first surface is oriented in facing relationship to said table means as said web first surface reaches said table means, whereby said binder substance is pressed into said webs in a direction away from said table means along with air disposed in said webs,
   a web second surface, located opposite said first surface, being exposed to ambient surroundings for a distance following the arrival of said webs at said table means to permit air to be expelled from said webs.

2. Apparatus according to claim 1, wherein said table means comprises a heating table over which the webs are passed.

3. Apparatus according to claim 2, wherein said table comprises a plurality of serially arranged heating panels.

4. Apparatus according to claim 2, wherein said heating panels are arranged in a generally upwardly arched configuration.

5. Apparatus according to claim 4, wherein said heating panels are flat and arranged end-to-end to define said upwardly arched configuration.

6. Apparatus according to claim 1 including heating elements disposed above said table means and above the webs traveling over said table means.

7. Apparatus according to claim 1 including a temperature control element positioned opposite said binder applying means under the respective webs.

8. Apparatus according to claim 1, wherein said reversing roller means comprise an upstream reversing roll and a downstream reversing roll, said feeder means comprising means for feeding two webs to each upstream reversing roll.

9. Apparatus according to claim 1 including foil delivery means for feeding a carrier foil between said webs and said table means.

10. Apparatus according to claim 9 including means for applying a second carrier foil atop said webs downstream of said temperature control zone.

11. Apparatus according to claim 1, wherein said stacking means includes means for stacking at least some of said webs in advance of said binder applying means.

12. Apparatus according to claim 11, wherein said stacking means includes means for stacking others of said webs upon webs already traveling along said table means.

13. A process for producing multi-level laminated plates, such as electronic circuit boards, from webs of pregnable fibrous material, said process comprising the steps of:
   providing a plurality of webs of pregnable fibrous material,
   advancing said webs,
   applying a binder substance to a web first surface as said webs are being advanced,
   stacking said webs one upon the other,
   conducting said webs in the stacked condition through a temperature control zone in which said web travel along a table means and in which the temperature of said binder substance in controlled,
   reversing the direction of web travel in advance of said table means and following the application of said binder substance so that said web first surface is oriented in facing relationship to said table means as said web first surface reaches said table means, whereby said binder substance is pressed into said webs in a direction away from said table means along with air disposed in said webs, and
   maintaining a web second surface, located opposite said web first surface, exposed to ambient surroundings for a distance following the arrival of said webs at said table means, to permit air to be expelled from said webs.

14. A process according to claim 13, wherein some of said webs are stacked in advance of the application of said binder substance.

15. A process according to claim 14, wherein others of said webs are stacked upon webs already traveling along said table means.

16. An apparatus for the production of multilayer laminated plates such as electronic circuit boards, comprising:
 feeder means for feeding a plurality of webs of material,
 applicator means for applying to the webs a binder with which the webs are to be impregnated,
 heater means defining a heating zone within which the material webs are combined, said heater means comprising
  a heating table over which the webs are passed, and heating elements disposed above said table and above the webs traveling over said table, and
 means for transporting the webs through said heating zone while being impregnated with the binder,
 there being a plurality of feeder means, at least some of which are disposed between successive ones of said heating elements.

17. An apparatus for the production of multilayer laminated plates such as electronic circuit boards, comprising:
 feeder neans for feeding a plurality of webs of material,
 applicator means for applying to the webs a binder with which the webs are to be impregnated,
 heater means defining a heating zone within which the material webs are combined,
 means for transporting the webs through said heating zone while being impregnated with the binder,
 reversing rolls arranged to guide said webs in a first direction opposite a second direction in which said webs travel through said heating zone and wherein top surfaces of the webs passing along said first direction become the bottom surfaces when the webs travel in said second direction,
 said applicator means arranged to apply binder onto the top surfaces of the webs while traveling in said first direction,
 said transporting means including means forcing the applied binder upwardly through the webs as the webs travel in said second direction through said heating zone, and
 a temperature control element positioned opposite said applicator means under the respective webs.

18. An apparatus for the production of multilayer laminated plates such as electronic circuit boards, comprising:
 feeder means for feeding a plurality of webs of material,
 applicator means for applying to the webs a binder with which the webs are to be impregnated,
 heater means defining a heating zone within which the material webs are combined,
 means for transporting the webs through said heating zone while being impregnated with the binder, and
 reversing rolls arranged to guide said webs in a first direction opposite a second direction in which said webs travel through said heating zone and wherein the top surfaces of the webs passing along said first direction become the bottom surfaces when the webs travel in said second direction,
 said applicator means arranged to apply binder onto the top surfaces of the webs while traveling in said first direction,
 said transporting means including means forcing the applied binder upwardly through the webs as the webs travel in said second direction through said heating zone,
 a temperature control element positioned opposite said applicator means under the respective webs,
 reversing rolls comprising an upstream reversing roll and a downstream reversing roll,
 said feeder means comprising means for feeding two webs to each upstream reversing roll.

19. An apparatus for the production of multilayer laminated plates such as electronic circuit boards, comprising:
 feeder means for feeding a plurality of webs of material,
 applicator means for applying to the webs a binder with which the webs are to be impregnated,
 heater means defining a heating zone within which the material webs are combined,
 means for transporting the webs through said heating zone while being impregnated with the binder,
 foil delivery means for feeding a carrier foil through said heating zones underneath said webs, and
 parting foil delivery means for feeding a carrier foil through said heating zone underneath said carrier foil.

20. An apparatus for the production of multilayer laminated plates such as electronic circuit boards, comprising:
 feeder means for feeding a plurality of webs of material,
 applicator neans for applying to the webs a binder with which the webs are to be impregnated,
 heater means defining a heating zone within which the material webs are combined,
 means for transporting the webs through said heating zone while being impregnated with the binder,
 foil delivery means for feeding a carrier foil through said heating zones underneath said webs,
 means for applying a second carrier foil atop said webs downstream of said heating means, and
 means for applying a second parting foil atop said second carrier foil.

* * * * *